(12) United States Patent
Taniuchi et al.

(10) Patent No.: US 11,503,716 B2
(45) Date of Patent: Nov. 15, 2022

(54) WIRING CIRCUIT BOARD ASSEMBLY SHEET AND PRODUCING METHOD THEREOF

(71) Applicant: NITTO DENKO CORPORATION, Osaka (JP)

(72) Inventors: Takuya Taniuchi, Osaka (JP); Ryohei Kakiuchi, Osaka (JP); Naoki Shibata, Osaka (JP); Yasunari Oyabu, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 113 days.

(21) Appl. No.: 17/265,922

(22) PCT Filed: Jul. 12, 2019

(86) PCT No.: PCT/JP2019/027676
§ 371 (c)(1),
(2) Date: Feb. 4, 2021

(87) PCT Pub. No.: WO2020/031615
PCT Pub. Date: Feb. 13, 2020

(65) Prior Publication Data
US 2021/0185826 A1    Jun. 17, 2021

(30) Foreign Application Priority Data
Aug. 10, 2018 (JP) .............................. JP2018-151348

(51) Int. Cl.
*H05K 1/02* (2006.01)
*H05K 3/06* (2006.01)

(52) U.S. Cl.
CPC ................. *H05K 3/06* (2013.01); *H05K 1/02* (2013.01); *H05K 2201/09781* (2013.01); *H05K 2203/0562* (2013.01); *H05K 2203/166* (2013.01)

(58) Field of Classification Search
CPC ....................... H05K 1/02; H05K 2201/09781
See application file for complete search history.

(56) References Cited

U.S. PATENT DOCUMENTS

2006/0169486 A1\* 8/2006 Funada ................ H05K 3/0052
174/254
2007/0034596 A1   2/2007 Ueno et al.
(Continued)

FOREIGN PATENT DOCUMENTS

JP    S59-094894 A    5/1984
JP    2000-200957 A   7/2000
(Continued)

OTHER PUBLICATIONS

Office Action, issued by the Japanese Patent Office dated Nov. 9, 2021, in connection with Japanese Patent Application No. 2018-151348.
(Continued)

*Primary Examiner* — Sherman Ng
(74) *Attorney, Agent, or Firm* — Edwards Neils LLC; Jean C. Edwards, Esq.

(57) ABSTRACT

A wiring circuit board assembly sheet is partitioned by a product region in which a plurality of wiring circuit boards serving as products are disposed in alignment and a margin region surrounding the product region with the margin region having a first area adjacent to the product region and a second area located at the opposite side of the product region with respect to the first area. The wiring circuit board assembly sheet includes a dummy wiring circuit board (Continued)

disposed in at least a portion of the first area and smaller than the wiring circuit board.

15 Claims, 8 Drawing Sheets

(56) References Cited

U.S. PATENT DOCUMENTS

| | | | | |
|---|---|---|---|---|
| 2008/0184558 A1* | 8/2008 | Haze | H05K 1/0271 | |
| | | | | 29/830 |
| 2009/0133902 A1* | 5/2009 | Kim | H05K 1/111 | |
| | | | | 174/250 |
| 2011/0048784 A1* | 3/2011 | Kim | H05K 3/242 | |
| | | | | 174/261 |
| 2011/0176246 A1* | 7/2011 | Kim | H01L 24/19 | |
| | | | | 156/196 |
| 2012/0033395 A1* | 2/2012 | Ishii | H05K 3/4644 | |
| | | | | 29/829 |
| 2012/0087099 A1* | 4/2012 | Moon | H01L 23/544 | |
| | | | | 361/783 |
| 2014/0101934 A1 | 4/2014 | Ishii et al. | | |
| 2017/0257954 A1 | 9/2017 | Ishii et al. | | |

FOREIGN PATENT DOCUMENTS

| | | |
|---|---|---|
| JP | 2000-208881 A | 7/2000 |
| JP | 2001-015888 A | 1/2001 |
| JP | 2004-140587 A | 5/2004 |
| JP | 2006-049425 A | 2/2006 |
| JP | 2006-120867 A | 5/2006 |
| JP | 2007-048963 A | 2/2007 |
| JP | 2010-192530 A | 9/2010 |
| JP | 2011-135153 A | 7/2011 |
| JP | 2012-019027 A | 1/2012 |
| JP | 2012-038380 A | 2/2012 |
| JP | 2012-038914 A | 2/2012 |

OTHER PUBLICATIONS

International Search Report Issued in PCT/JP2019/027676 dated Aug. 13, 2019.
Written Opinion Issued in PCT/JP2019/027676 dated Aug. 13, 2019.
Decision to Grant a Patent issued by the Japanese Patent Office dated Dec. 21, 2021, in connection with Japanese Patent Application No. 2018-151348.

* cited by examiner

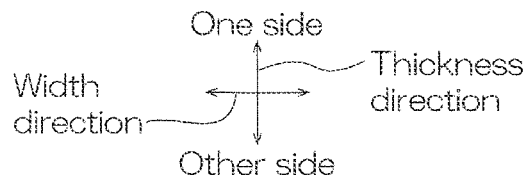
FIG. 7D
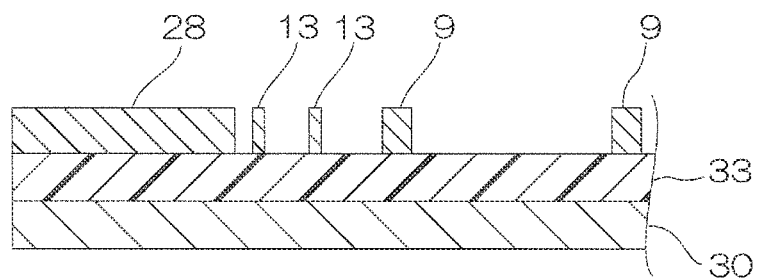
FIG. 7E
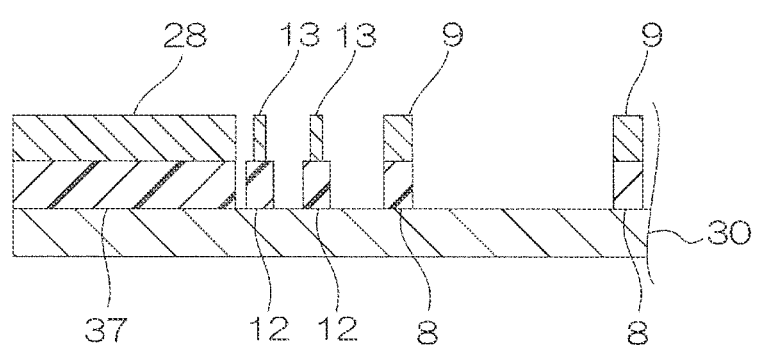
FIG. 7F
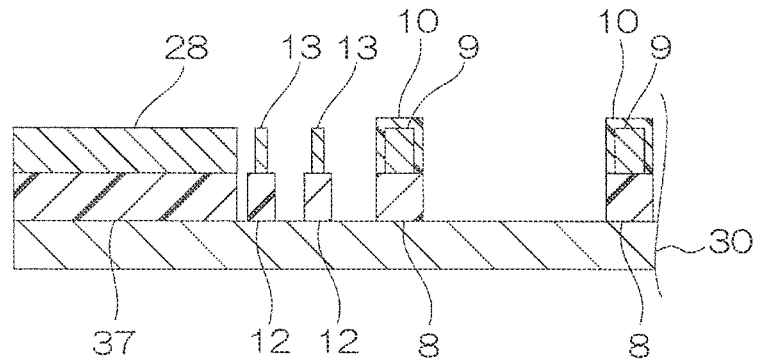

ered in alignment and a margin region surrounding the product region with the margin region having a first area adjacent to the product region and a second area located at the opposite side of the product region with respect to the first area, wherein the wiring circuit board assembly sheet includes a dummy wiring circuit board disposed in at least a portion of the first area and smaller than the wiring circuit board.
WIRING CIRCUIT BOARD ASSEMBLY SHEET AND PRODUCING METHOD THEREOF

CROSS-REFERENCE TO RELATED APPLICATIONS

The present application is a 35 U.S.C. 371 National Stage Entry PCT/JP2019/027676, filed on Jul. 12, 2019, which claims priority from Japanese Patent Application No. 2018-151348, filed on Aug. 10, 2018, the contents of all of which are herein incorporated by reference in their entirety.

TECHNICAL FIELD

The present invention relates to a wiring circuit board assembly sheet and a method for producing a wiring circuit board assembly sheet.

BACKGROUND ART

Conventionally, a method for producing a printed board has been known in which a resist film is formed on the upper surface of a copper foil, and then, by carrying out etching, a plurality of circuit patterns are formed from the copper foil.

For example, in the method for producing a printed board for forming a circuit pattern including a plurality of lines which are spaced apart, it has been proposed that a resist film is formed into a pattern having a dummy pattern in a portion of wide line spacing (ref: for example, Patent Document 1 below).

In Patent Document 1 below, in the etching, the dummy pattern restricts the flow of an etching solution, thus, an amount of progress of side etching between the lines is suppressed, and a desired line width in the circuit pattern is ensured.

CITATION LIST

Patent Document
Patent Document 1: Japanese Unexamined Patent Publication No. 2000-200957

SUMMARY OF THE INVENTION

Problem to be Solved by the Invention

However, in Patent Document 1 described above, first, it is necessary to specify the above-described portion of wide line spacing in a plurality of lines, and dispose the resist film corresponding to the dummy pattern for each portion, so that the procedure is complicated.

Furthermore, in the method described in Patent Document 1 described above, at the inside (central portion) of the area where the plurality of circuit patterns are disposed, it is possible to ensure the desired line width in the circuit pattern at both sides of the portion of wide line spacing. In the circuit pattern disposed at the peripheral end portion (outer end portion) of the area, since the resist is not disposed at the outside of the area, the flow (rate) of the etching solution is not limited, and as a result, there is a problem that the line width in the circuit pattern described above is narrowed, and the desired line width is not ensured.

The present invention provides a method for producing a wiring circuit board assembly sheet capable of easily producing a wiring circuit board with high reliability, and a wiring circuit board assembly sheet obtained by the producing method.

Means for Solving the Problem

The present invention (1) includes a wiring circuit board assembly sheet partitioned by a product region in which a plurality of wiring circuit boards serving as products are disposed in alignment and a margin region surrounding the product region with the margin region having a first area adjacent to the product region and a second area located at the opposite side of the product region with respect to the first area, wherein the wiring circuit board assembly sheet includes a dummy wiring circuit board disposed in at least a portion of the first area and smaller than the wiring circuit board.

However, in the wiring circuit board assembly sheet partitioned by the product region in which the plurality of wiring circuit boards serving as the products are disposed in alignment and the margin region surrounding the product region, in a production step thereof, a wiring made of a conductive layer and a support substrate made of a metal-based layer are formed by etching. In this case, when an etching resist is disposed in the product region, and the etching is carried out, an etching solution reaches the margin region, while being brought into contact with the etching resist to form the wiring and the support substrate.

However, the etching resist is not disposed in the margin region. Therefore, when the etching solution reaches the margin region from the product region, the etching solution falls down quickly to cause turbulence in the etching solution. As a result, the accuracy of the wiring of the wiring circuit board and the support substrate located at the inside of the margin region in the product region decreases.

However, in the wiring circuit board assembly sheet, the margin region has the first area adjacent to the product region and the second area located at the opposite side of the product region with respect to the first area. Further, since the dummy wiring circuit board is disposed in at least a portion of the first area, when the etching solution reaches the second area from the product region, even in a case where the etching solution falls down to cause the turbulence, the accuracy of the dummy wiring circuit board decreases, and the influence of the turbulence of the etching solution with respect to the wiring circuit board decreases, so that a decrease in the accuracy of the wiring circuit board is suppressed. Therefore, in the wiring circuit board assembly sheet, it is excellent in reliability of the wiring circuit board.

The present invention (2) includes the wiring circuit board assembly sheet described in (1), wherein the dummy wiring circuit board is disposed in the entire first area.

In the wiring circuit board assembly sheet, even when the turbulence of the etching solution occurs in the entire second area, since the dummy wiring circuit board is disposed in the entire first area, it is possible to decrease the influence of the turbulence of the etching solution with respect to the entire product region.

The present invention (3) includes the wiring circuit board assembly sheet described in (1) or (2), wherein the wiring circuit board includes a wiring made of a conductive layer and the dummy wiring circuit board includes a dummy wiring made of the conductive layer.

When the wiring circuit board includes the wiring made of the conductive layer, and the dummy wiring circuit board includes the dummy wiring made of the conductive layer, in the production of the wiring circuit board assembly sheet, the etching resist is disposed on the conductive layer corresponding to the wiring and the dummy wiring. Then, when the etching solution reaches the second area from the first area, even in a case where the etching solution falls down to cause the turbulence, the accuracy of the dummy wiring decreases, and a decrease in the accuracy of the wiring is suppressed. Therefore, in the wiring circuit board assembly sheet, it is excellent in reliability of the wiring.

The present invention (4) includes the wiring circuit board assembly sheet described in (3), wherein the wiring circuit board assembly sheet has a long shape, has both end portions in a width direction perpendicular to a longitudinal direction and included in the second area, and includes a conductive end portion disposed at both end portions in the width direction and made of the conductive layer.

When the wiring circuit board assembly sheet has a long shape, the wiring circuit board assembly sheet is produced by etching, while being conveyed in the longitudinal direction.

In the etching step, since the etching solution falls from both end edges in the width direction of the wiring circuit board assembly sheet, the turbulence of the etching solution occurs at both end portions in the width direction.

However, in the case of forming the conductive end portion, since both end portions in the width direction included in the second area and an etching resist protruding therefrom toward both outer sides in the width direction are provided, even when the turbulence occurs in the etching described above, the product region is less susceptible to the influence. Therefore, it is possible to obtain the wiring circuit board having excellent reliability.

The present invention (5) includes the wiring circuit board assembly sheet described in any one of (1) to (4), wherein the wiring circuit board includes a support substrate made of a metal-based layer, and the dummy wiring circuit board includes a dummy support substrate made of the metal-based layer.

When the wiring circuit board includes the support substrate made of the metal-based layer, and the dummy wiring circuit board includes the support substrate made of the metal-based layer, in the production of the wiring circuit board assembly sheet, the etching resist is disposed on the metal-based layer corresponding to the support substrate and the dummy support substrate. Then, when the etching solution reaches the second area from the first area, even in a case where the etching solution falls down to cause the turbulence, the accuracy of the dummy support substrate decreases, and a decrease in the accuracy of the support substrate is suppressed. Therefore, in the wiring circuit board assembly sheet, it is excellent in reliability of the support substrate.

The present invention (6) includes the wiring circuit board assembly sheet described in (5), wherein the wiring circuit board assembly sheet has a long shape, has both end portions in a width direction perpendicular to a longitudinal direction and included in the second area, and includes a metal-based end portion disposed at both end portions in the width direction and made of the metal-based layer.

When the wiring circuit board assembly sheet has a long shape, the wiring circuit board assembly sheet is produced by etching, while being conveyed in the longitudinal direction.

In the etching step, since the etching solution falls from both end edges in the width direction of the wiring circuit board assembly sheet, the turbulence of the etching solution occurs at both end portions in the width direction.

However, in the case of forming the support substrate end portion, since both end portions in the width direction included in the second area and an etching resist protruding therefrom toward both outer sides in the width direction are provided, even when the turbulence occurs in the etching described above, the product region is less susceptible to the influence. Therefore, it is possible to obtain the wiring circuit board having excellent reliability.

The present invention (7) includes a wiring circuit board assembly sheet partitioned by a product region in which a plurality of wiring circuit boards serving as products are disposed in alignment and a margin region surrounding the product region, wherein the wiring circuit board includes a wiring made of a conductive layer; and the wiring circuit board assembly sheet has a long shape, has both end portions in a width direction perpendicular to a longitudinal direction and included in the margin region, and includes a conductive end portion disposed at both end portions in the width direction and made of the conductive layer.

In the etching step, since the etching solution falls from both end edges in the width direction of the wiring circuit board assembly sheet, the turbulence of the etching solution occurs at both end portions in the width direction.

However, in the case of forming the conductive end portion, since both end portions in the width direction included in the second area and an etching resist protruding therefrom toward both outer sides in the width direction are provided, even when the turbulence occurs in the etching described above, the product region is less susceptible to the influence. Therefore, it is possible to obtain the wiring circuit board having excellent reliability.

The present invention (8) includes a wiring circuit board assembly sheet partitioned by a product region in which a plurality of wiring circuit boards serving as products are disposed in alignment and a margin region surrounding the product region, wherein the wiring circuit board includes a support substrate made of a metal-based layer; and the wiring circuit board assembly sheet has a long shape, has both end portions in a width direction perpendicular to a longitudinal direction and included in the margin region, and includes a metal-based end portion disposed at both end portions in the width direction and made of the metal-based layer.

In the etching step, since the etching solution falls from both end edges in the width direction of the wiring circuit board assembly sheet, the turbulence of the etching solution occurs at both end portions in the width direction.

However, in the case of forming the support substrate end portion, since both end portions in the width direction included in the second area and an etching resist protruding therefrom toward both outer sides in the width direction are provided, even when the turbulence occurs in the etching described above, the product region is less susceptible to the influence. Therefore, it is possible to obtain the wiring circuit board having excellent reliability.

The present invention (9) includes a method for producing a wiring circuit board assembly sheet, the wiring circuit board assembly sheet described in (3) including a first step of disposing a first etching resist on a conductive layer so as to correspond to a wiring and a dummy wiring, and a second step of etching the conductive layer exposed from the first etching resist to form the wiring and the dummy wiring.

In the first step, when the first etching resist is disposed on the conductive layer so as to correspond to the wiring and the dummy wiring, in the second step, even when a width of the dummy wiring cannot be sufficiently ensured by side etching of the dummy wiring caused by the turbulence of the etching solution in the first area, the product region is less susceptible to the influence of the turbulence, and it is possible to sufficiently ensure the width of the wiring.

The present invention (10) includes the method for producing a wiring circuit board assembly sheet described in (9), wherein the conductive layer is conveyed along a conveyance direction in the second step and has both end portions in a width direction perpendicular to the conveyance direction and included in the second area, and in the first step, the first etching resist is formed so as to cover one surface in a thickness direction of both end portions in the width direction of the conductive layer and protrude from both end portions in the width direction of the conductive layer toward both outer sides in the width direction.

By forming the first etching resist so as to cover one surface in the thickness direction of both end portions in the width direction of the conductive layer and protrude from both end portions in the width direction of the conductive layer toward both outer sides in the width direction, in the etching step, it is possible to move away the place where the turbulence of the etching solution is likely to occur from the product region. Thus, it is possible to decrease the influence of the turbulence of the etching solution in the product region.

The present invention (11) includes a method for producing a wiring circuit board assembly sheet, the wiring circuit board assembly sheet described in (5) including a third step of disposing a second etching resist on a metal-based layer so as to correspond to a support substrate and a dummy support substrate, and a fourth step of etching the metal-based layer exposed from the second etching resist to form the support substrate and the dummy support substrate.

In the third step, when the second etching resist is disposed on the metal-based layer so as to correspond to the support substrate and the dummy support substrate, in the fourth step, even when a width of the dummy support substrate cannot be sufficiently ensured by side etching of the dummy support substrate caused by the turbulence of the etching solution in the first area, the product region is less susceptible to the influence of the turbulence, and it is possible to sufficiently ensure the width of the wiring.

The present invention (12) includes the method for producing a wiring circuit board assembly sheet described in (11), wherein the metal-based layer is conveyed along a conveyance direction in the fourth step and has both end portions in a width direction perpendicular to the conveyance direction and included in the second area, and in the third step, the second etching resist is formed so as to cover one surface in a thickness direction of both end portions in the width direction of the metal-based layer and protrude from both end portions in the width direction of the metal-based layer toward both outer sides in the width direction.

By forming the second etching resist so as to cover one surface in the thickness direction of both end portions in the width direction of the metal-based layer and protrude from both end portions in the width direction of the metal-based layer toward both outer sides in the width direction, in the etching step, it is possible to move away the place where the turbulence of the etching solution is likely to occur from the product region. Thus, it is possible to decrease the influence of the turbulence of the etching solution in the product region.

Effect of the Invention

In the wiring circuit board assembly sheet of the present invention, it is excellent in reliability of a wiring circuit board.

The method for producing a wiring circuit board assembly sheet of the present invention can easily produce a wiring circuit board having excellent reliability.

BRIEF DESCRIPTION OF THE DRAWINGS

FIG. 2A illustrating a substrate preparation step,

FIG. 2B illustrating a resist disposing step,

FIG. 2C illustrating an etching step, and

FIG. 2D illustrating a resist removing step and a cover step.

FIG. 5A illustrating a resist disposing step,

FIG. 5B illustrating an etching step, and

FIG. 5C illustrating a resist removing step and a cover step.

FIG. 6A illustrating a substrate preparation step,

FIGS. 7D to 7F, subsequent to FIG. 6C, show production steps (cross-sectional view) of the third embodiment of the wiring circuit board assembly sheet:

FIG. 7D illustrating a first resist removing step,

FIG. 7E illustrating a base layer forming step, and

FIG. 7F illustrating a cover step.

FIG. 8G illustrating a second resist disposing step,

FIG. 8H illustrating a second etching step, and

FIG. 8I illustrating a second resist removing step.

DESCRIPTION OF EMBODIMENTS

A first embodiment of a wiring circuit board assembly sheet of the present invention is described with reference to FIGS. 1 to 2D.

Figure 1:
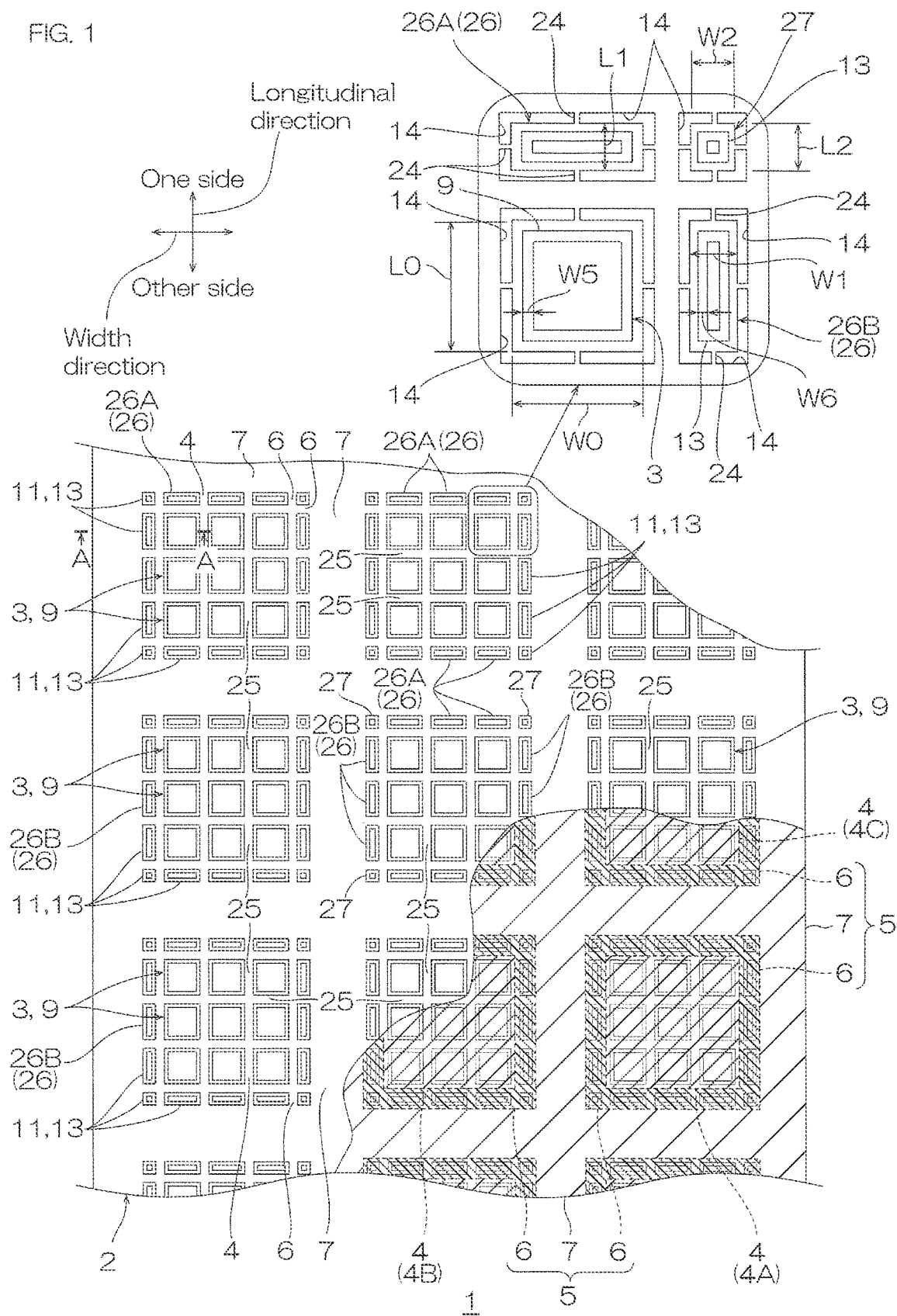
FIG. 1 shows a plan view of a first embodiment of a wiring circuit board assembly sheet of the present invention.

An upper-right surrounded view in FIG. 1 is an enlarged view of a wiring circuit board and a dummy wiring circuit board, and a lower-right view shown by hatching is a view obtained by dividing each area by the kind of hatching.

As shown in FIG. 1, a wiring circuit board assembly sheet 1 has a long sheet shape extending along a longitudinal direction. The wiring circuit board assembly sheet 1 has a predetermined length in a width direction perpendicular to the longitudinal direction. As shown in FIG. 2D, the wiring circuit board assembly sheet 1 has one surface and the other surface facing each other at spaced intervals in a thickness direction perpendicular to the longitudinal direction and the width direction.

Figure 2A:
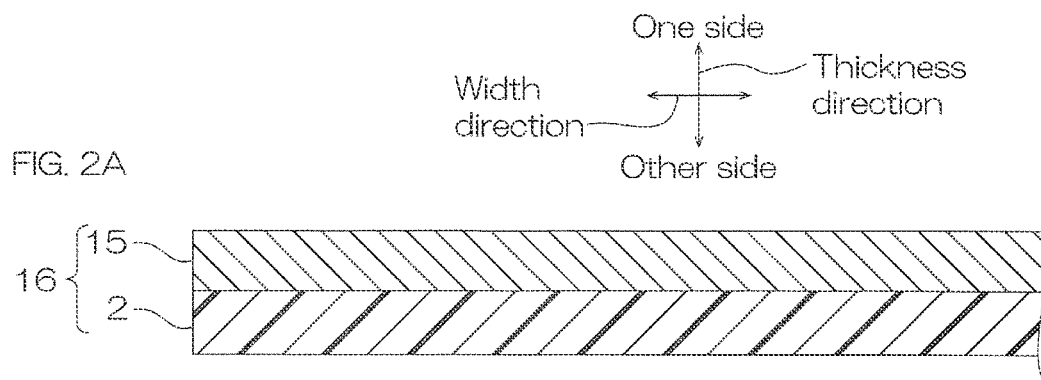
FIGS. 2A to 2D show production steps of the wiring circuit board assembly sheet shown in FIG. 1, and cross-sectional views along an A-A line of FIG. 1.
Figure 2B:
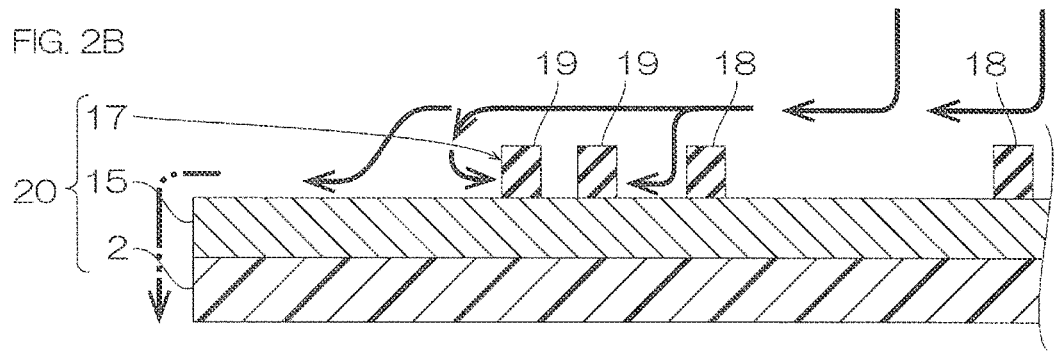
Figure 2C:
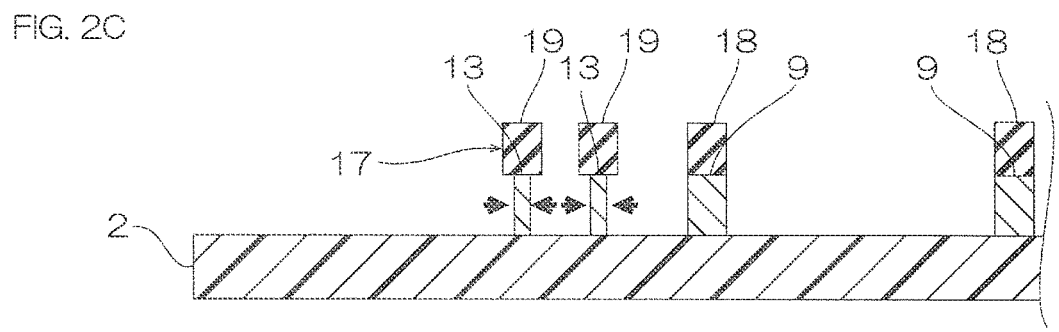
Figure 2D:
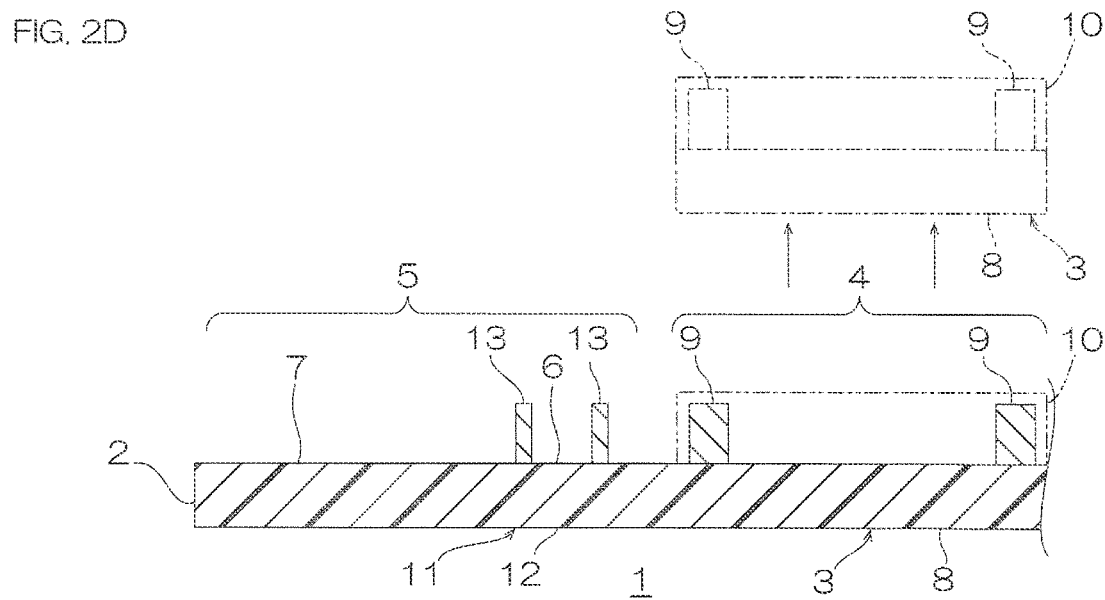

As shown in FIGS. 1 and 2D, the wiring circuit board assembly sheet 1 includes a support sheet 2 and a plurality of wiring circuit boards 3.

The support sheet 2 has the same shape (outer shape) as the wiring circuit board assembly sheet 1 when viewed from the top. Examples of a material for the support sheet 2 include resins such as polyimide. A thickness of the support sheet 2 is, for example, 1 µm or more, and 1 mm or less.

The wiring circuit board 3 has a generally rectangular shape when viewed from the top. The plurality of wiring circuit boards 3 are disposed in alignment in the support sheet 2. Further, each of the plurality of wiring circuit boards 3 is supported separately with respect to the support sheet 2. Specifically, as shown by the upper-right enlarged view of FIG. 1, an opening portion 14 is formed around the wiring circuit board 3, and the wiring circuit board 3 is connected to the surrounding support sheet 2 via a joint 24. The opening portion 14 has a generally rectangular frame shape when viewed from the top surrounding the wiring circuit board 3, and penetrates the support sheet 2 in the thickness direction.

The joint 24 traverses the opening portion 14, thereby suspending the support sheet 2 in the wiring circuit board 3. The joint 24 has the same material and thickness as that of the support sheet 2. A layer configuration of the wiring circuit board 3 is described later. The wiring circuit board 3 is a product in the wiring circuit board assembly sheet 1 unlike a dummy wiring circuit board 11 to be described later.

In the wiring circuit board assembly sheet 1, a product region 4 and a margin region 5 are partitioned.

The product region 4 is a region partitioned into a generally rectangular shape when viewed from the top. In the wiring circuit board assembly sheet 1, the product regions 4 are disposed in alignment with sufficient intervals to each other (specifically, the region where the margin region 5 to be described later is provided) in the longitudinal direction and the width direction.

In each of the plurality of product regions 4, the plurality of wiring circuit boards 3 are disposed in alignment with slight gaps 25 from each other. Specifically, in the product region 4, the wiring circuit boards 3 adjacent to each other are separated with the minute gap 25 therebetween, and the gap 25 is set as small (narrow) as possible from the viewpoint of improving the yield of the wiring circuit board 3 in the wiring circuit board assembly sheet 1. A ratio of a length (width) of the gap 25 separating the wiring circuit boards 3 adjacent to each other to a width of the wiring circuit board 3 is, for example, 0.1 or less, preferably 0.01 or less, more preferably 0.001 or less, and for example, 0.0001 or more. Specifically, the length (width) of the gap 25 separating the wiring circuit boards 3 adjacent to each other is, for example, 100 µm or less, preferably 50 µm or less, more preferably 10 µm or less, and for example, 0.1 µm or more. In the product region 4, any gap 25 has the same width. That is, the wiring circuit boards 3 are disposed in alignment separated by the gaps 25 each having an equal width.

The margin region 5 surrounds the product region 4. Specifically, the margin region 5 has a generally rectangular frame shape surrounding the one product region 4. Specifically, in the wiring circuit board assembly sheet 1, the margin region 5 has a generally well girder shape, and a belt shape extending along both end edge portions in the width direction of the support sheet 2 in the longitudinal direction when viewed from the top. That is, as for the margin region 5 having a generally well girder shape, one margin region 5 corresponding to one product region 4A and the other margin region 5 corresponding to the other product region 4B adjacent to one product region 4A are continuous.

The margin region 5 has a first area 6 and a second area 7.

In the lower-right of FIG. 1, the first area 6 is hatched with a diagonal line from the upper-left toward the lower-right, and the second area 7 is hatched with a diagonal line from the upper-right toward the lower-left.

The first area 6 is adjacent to the product region 4. Specifically, the first area 6 is disposed in the vicinity of the product region 4, i.e., close to the periphery of the product region 4. The first area 6 is partitioned into a generally rectangular frame shape when viewed from the top surrounding the immediate outer-side vicinity of the product region 4. That is, an inner dimension of the first area 6 is set generally the same as an outer dimension of the product region 4.

In the first area 6, the dummy wiring circuit board 11 to be described later is disposed.

The second area 7 is located at the opposite side of the product region 4 with respect to the first area 6. That is, the second area 7 is remotely located at the outside of the product region 4 separated by the first area 6. In other words, the second area 7 surrounds the first area 6.

The second area 7 is partitioned into a generally rectangular frame shape when viewed from the top surrounding the immediate outer-side vicinity of the first area 6. That is, an inner dimension of the second area 7 is set generally the same as an outer dimension of the first area 6.

The second area 7 located between the two product regions 4A and 4B disposed adjacent to each other is shared by the two product regions 4A and 4B.

In the second area 7, any of the wiring circuit board 3 and the dummy wiring circuit board 11 (described later) is not disposed, and thus, the second area 7 is partitioned as the blank area in the margin region 5.

In the wiring circuit board assembly sheet 1, the first area 6 and the second area 7 are disposed in order toward the outer side of the product region 4 (outer side in a plane direction perpendicular to the thickness direction).

The margin region 5 does not include the gap 25 at the inside of the product region 4, i.e., is distinguished from the gap 25. A width of the margin region 5 is sufficiently wide, and specifically, a ratio (width of the margin region 5/width of the product region 4) of a width of the margin region 5 to a width of the product region 4 is, for example, 10 or more, preferably 100 or more, more preferably 1,000 or more, and for example, 100,000 or less.

A width of the margin region 5 between the product regions 4A and 4B adjacent to each other in the width direction is a length in the width direction. A width of the margin region 5 between the product regions 4A and 4C adjacent to each other in the longitudinal direction is a length in the longitudinal direction. Furthermore, a width of the margin region 5 located at the outer-most side in the width direction is a length in the width direction between the end edge in the width direction of the margin region 5 and the product region 4A (or 4C) located at the outer-most side in the width direction. The length in the width direction, the length in the longitudinal direction, or the like of the margin region 5 described above can be collectively referred to as a length in a short-length direction of the margin region 5.

Specifically, the length in the short-length direction of the margin region 5 is, for example, 5 mm or more, preferably 10 mm or more, more preferably 20 mm or more, and for example, 50 mm or less.

Next, a layer configuration of the wiring circuit board 3, and an arrangement and a layer configuration of the dummy wiring circuit board 11 are described in detail in order.

As shown in FIG. 2D, the wiring circuit board 3 includes a base layer 8, a wiring 9 disposed on one surface in the thickness direction of the base layer 8, and a cover layer 10

(phantom line) disposed on one surface in the thickness direction of the base layer 8 so as to cover the wiring 9.

The base layer 8 has the same shape as the wiring circuit board 3 when viewed from the top. The base layer 8 is partitioned from the surrounding support sheet 2 by the opening portion 14 (ref: FIG. 1). A material and a thickness of the base layer 8 are the same as those of the support sheet 2.

The wiring 9 has a pattern included in the base layer 8 when viewed from the top. A pattern shape of the wiring 9 is not particularly limited, and is appropriately set in accordance with its application and purpose. Examples of the wiring 9 include a signal line (differential wiring etc.), a power line (power supply wiring etc.), a ground line (ground wiring etc.), and an antenna line (transmission and reception line etc.). The wiring 9 may further include, for example, an auxiliary portion (terminal etc.) (not shown) corresponding to the function of each wiring described above when viewed from the top.

The wiring 9 is made of a conductive layer 15 to be described later (ref: FIGS. 2A to 2B).

Examples of a material for the wiring 9 include conductors such as a metal-based material (specifically, metal material). Examples of the metal-based material include metal elements classified in the Group 1 to Group 16 in the Periodic Table, and alloys including two or more kinds of metal elements. The metal-based material may be any of transition metals and typical metals. More specifically, examples of the metal-based material include Group 2 metal elements such as calcium, Group 4 metal elements such as titanium and zirconium, Group 5 metal elements such as vanadium, Group 6 metal elements such as chromium, molybdenum, and tungsten, Group 7 metal elements such as manganese, Group 8 metal elements such as iron, Group 9 metal elements such as cobalt, Group 10 metal elements such as nickel and platinum, Group 11 metal elements such as copper, silver, and gold, Group 12 metal elements such as zinc, Group 13 metal elements such as aluminum and gallium, and Group 14 metal elements such as germanium and tin. These can be used alone or in combination of two or more.

A ratio of a thickness of the wiring 9 to a thickness of the base layer 8 is, for example, 0.5 or more, preferably 1.0 or more, more preferably 1.5 or more, and for example, 3.0 or less. Specifically, the thickness of the wiring 9 is, for example, 1 μm or more, and 1,000 μm or less. A width of the wiring 9 is, for example, 10 μm or more, and 1,000 μm or less.

The cover layer 10 covers one surface of the base layer 8 exposed from the wiring 9, and the side surfaces and one surface in the thickness direction of the wiring 9. A material for the cover layer 10 is the same as that for the base layer 8. A ratio of a thickness of the cover layer 10 to a thickness of the base layer 8 is, for example, 0.2 or more, preferably 0.3 or more, more preferably 0.5 or more, and for example, 2.0 or less. Specifically, the thickness of the cover layer 10 is, for example, 25 μm or more, and 1,000 μm or less. The dummy wiring circuit board 11 is disposed in the first area 6. Specifically, the dummy wiring circuit board 11 is disposed in the entire first area 6. Specifically, the plurality of dummy wiring circuit boards 11 are disposed at spaced intervals to each other in a row along the frame forming the first area 6 in the first area 6.

Specifically, the dummy wiring circuit board 11 has a first dummy wiring circuit board 26 disposed at both sides in the longitudinal direction and both sides in the width direction of the product region 4, and a second dummy wiring circuit board 27 disposed at the obliquely outer side of the product region 4.

First dummy wiring circuit boards 26A disposed at each of both sides in the longitudinal direction of the product region 4 are disposed in a row at spaced intervals in the width direction. A pitch in the width direction of the first dummy wiring circuit board 26A, and a pitch in the width direction of the wiring circuit board 3 are the same. Specifically, each of the length and the interval in the width direction of the first dummy wiring circuit board 26A, and each of the length and the interval in the width direction of the wiring circuit board 3 are the same.

On the other hand, a length L1 in the longitudinal direction of the first dummy wiring circuit board 26A, and a length L0 in the longitudinal direction of the wiring circuit board 3 satisfy, for example, the following formula (5), preferably, satisfy the following formula (6), more preferably, satisfy the following formula (7), and also satisfy the following formula (8).

$$L1 < L0 \tag{5}$$

$$L1 < 0.5 \times L0 \tag{6}$$

$$L1 < 0.25 \times L0 \tag{7}$$

$$0.001 \times L0 < L1 \tag{8}$$

First dummy wiring circuit boards 26B disposed at each of both sides in the width direction of the product region 4 are disposed in a row at spaced intervals in the longitudinal direction. A pitch in the longitudinal direction of the first dummy wiring circuit board 26B, and a pitch in the longitudinal direction of the wiring circuit board 3 are the same. Specifically, each of the length and the interval in the longitudinal direction of the first dummy wiring circuit board 26B, and each of the length and the interval in the longitudinal direction of the wiring circuit board 3 are the same.

On the other hand, a length W1 in the width direction of the first dummy wiring circuit board 26B, and a length W0 in the width direction of the wiring circuit board 3 satisfy, for example, the following formula (9), preferably, satisfy the following formula (10), more preferably, satisfy the following formula (11), and also satisfy the following formula (12).

$$W1 < W0 \tag{9}$$

$$W1 < 0.5 \times W0 \tag{10}$$

$$W1 < 0.25 \times W0 \tag{11}$$

$$0.001 \times W0 < W1 \tag{12}$$

The second dummy wiring circuit board 27 is smaller than the first dummy wiring circuit board 26. Specifically, each of a length L2 and a width W2 of the second dummy wiring circuit board 27 is the same as each of the length L1 of the first dummy wiring circuit board 26A disposed at both sides in the longitudinal direction of the product region 4, and the width W1 of the first dummy wiring circuit board 26B disposed at both sides in the width direction of the product region 4.

The second dummy wiring circuit board 27 is disposed in each of the four corners of the frame forming the first area 6.

Thus, in the area obtained by combining the product region 4 and the first area 6, the wiring circuit board 3, the first dummy wiring circuit board 26, and the second dummy wiring circuit board 27 are disposed in alignment at equal intervals (with the minute gaps 25) therebetween.

The dummy wiring circuit board 11 is smaller than the wiring circuit board 3. Specifically, the dummy wiring circuit board 11 is smaller than the wiring circuit board 3 when viewed from the top, and in particular, the flat area S1 of the dummy wiring circuit board 11 and the flat area S0 of the wiring circuit board 3 satisfy the following formula (13), preferably, satisfy the following formula (14), more preferably, satisfy the following formula (15), further more preferably, satisfy the following formula (16).

$$S1<S0 \tag{13}$$

$$S1<0.8\times S0 \tag{14}$$

$$S1<0.5\times S0 \tag{15}$$

$$S1<0.3\times S0 \tag{16}$$

When the flat area of the dummy wiring circuit board 11 is different from each other, specifically, when the dummy wiring circuit board 11 has the first dummy wiring circuit board 26, and the second dummy wiring circuit board 27 having the flat area smaller than the flat area of the first dummy wiring circuit board 26, the above-described flat area S1 of the dummy wiring circuit board 11 described above means the flat area of the first dummy wiring circuit board 26.

Although the dummy wiring circuit board 11 has the same layer configuration as the wiring circuit board 3, unlike the wiring circuit board 3, the dummy wiring circuit board 11 is not collected (sampled) from the wiring circuit board assembly sheet 1 as a product to remain in a state of being supported by the support sheet 2. That is, the dummy wiring circuit board 11 is not a product.

As shown in FIG. 2D, specifically, the dummy wiring circuit board 11 includes a dummy base layer 12, and a dummy wiring 13 disposed on one surface in the thickness direction of the dummy base layer 12. The dummy base layer 12 and the dummy wiring 13 have the same layer configuration and thickness as that of the base layer 8 and the wiring 9 of the wiring circuit board 3.

The dummy base layer 12 is partitioned by the opening portion 14 (ref: FIG. 1). The dummy wiring 13 is made of the conductive layer 15 (ref: FIGS. 2A to 2B).

A width of the dummy wiring 13 is also allowed to be narrower than the width of the wiring 9. Specifically, a width W6 of the dummy wiring 13, and a width W5 of the wiring 9 satisfy the following formula (17), and furthermore, satisfy the following formula (18).

$$W6<W5 \tag{17}$$

$$0.01\times W5<W6<0.5\times W5 \tag{18}$$

Next, a method for producing the wiring circuit board assembly sheet 1 is described.

As shown in FIGS. 2A to 2D, the method for producing the wiring circuit board assembly sheet 1 includes a substrate preparation step, a resist disposing step as one example of a first step, an etching step as one example of a second step, a resist removing step, and a cover step.

In the method for producing the wiring circuit board assembly sheet 1, each step described above is carried out in order.

Further, the method for producing the wiring circuit board assembly sheet 1 is, for example, carried out in accordance with a roll-to-roll method. In the roll-to-roll method, a delivery roll and a winding roll (both are not shown) disposed at both outer sides in the longitudinal direction (depth direction on the plane of the sheet in FIGS. 2A to 2D) of the wiring circuit board assembly sheet 1 are used in a device for producing each layer which is not shown, and in each step, each member delivered from the delivery roll is delivered toward the winding roll.

As shown in FIG. 2A, in the substrate preparation step, a two-layer substrate 16 including the support sheet 2 and the conductive layer 15 disposed on one surface in the thickness direction of the support sheet 2 is prepared. The two-layer substrate 16 preferably includes only the support sheet 2 and the conductive layer 15.

In the substrate preparation step, the opening portion 14 described above (ref: the upper-right view of FIG. 1) is not yet formed in the support sheet 2, and therefore, the support sheet 2 is prepared as a long sheet continuous in the longitudinal direction without having the opening portion 14.

The conductive layer 15 is disposed on the entire one surface in the thickness direction of the support sheet 2. In the substrate preparation step, the pattern corresponding to the wiring 9 and the dummy wiring 13 described above is not yet formed in the conductive layer 15, and the conductive layer 15 is prepared as a long conductive sheet continuous in the longitudinal direction. A material and a thickness of the conductive layer 15 are the same as those of the wiring 9 described above.

To prepare the two-layer substrate 16, for example, a resin is applied to the other surface in the thickness direction of the conductive layer 15 to be then dried to form the support sheet 2. Or, it is also possible to prepare the two-layer substrate 16 including the support sheet 2 and the conductive layer 15 in advance.

As shown in FIG. 2B, in the resist disposing step, a first etching resist 17 is disposed on one surface in the thickness direction of the conductive layer 15 so as to correspond to the wiring 9 and the dummy wiring 13 (ref: FIG. 2C).

To dispose the first etching resist 17 on the conductive layer 15, though not shown, for example, first, a sheet-shaped dry film resist is disposed on the entire one surface in the thickness direction of the conductive layer 15. Next, the first etching resist 17 is formed from the dry film resist by photolithography (exposing and developing) so as to have a shape corresponding to the wiring 9 and the dummy wiring 13.

Specifically, the first etching resist 17 includes a resist product portion 18 corresponding to the wiring 9, and a resist dummy portion 19 corresponding to the dummy wiring 13. Both the resist product portion 18 and the resist dummy portion 19 have the same width as the wiring 9 to be formed next when viewed from the top.

Thus, a resist laminate 20 including the support sheet 2, the conductive layer 15, and the first etching resist 17 in order toward one side in the thickness direction is fabricated.

As shown in FIG. 2C, in the etching step, by etching the conductive layer 15 exposed from the first etching resist 17, the wiring 9 and the dummy wiring 13 are formed.

Specifically, in the etching step, an etching device (not shown) having a discharge port (nozzle, showerhead, etc.) is used. The discharge port (not shown) is disposed at one side in the thickness direction of the resist laminate 20, and disposed in parallel in the width direction of the resist laminate 20. Specifically, the discharge port is provided so as to face at least the resist product portion 18.

In the etching step, as shown by thick line arrows of FIG. 2B, an etching solution from the discharge port is brought into contact with the resist product portion 18 and the conductive layer 15 exposed therefrom to reach the resist dummy portion 19 disposed at the outside thereof. Subsequently, the etching solution falls into the conductive layer 15 corresponding to the second area 7.

In the etching solution spreading from the resist product portion 18 toward the resist dummy portion 19, and subsequently, just before falling into the conductive layer 15 corresponding to the second area 7 from the resist dummy portion 19, i.e., in the etching around the resist dummy portion 19, turbulence occurs. Therefore, since the etching solution is brought into contact with the conductive layer 15 exposed from the resist dummy portion 19 at high speed, the etching rate of the conductive layer 15 is also increased. Then, as shown in FIG. 2C, the over-etched dummy wiring 13 is formed. For example, a width of the dummy wiring 13 is narrower than that of the resist dummy portion 19.

On the other hand, since the resist product portion 18 is disposed at the inside from the above-described place where the etching solution falls separated by the resist dummy portion 19, the influence of the turbulence described above is small (hardly affected), and thus, the acceleration of the etching solution caused by the turbulence is suppressed. Therefore, since the etching rate is also suppressed to be faster, the over-etching described above is suppressed. As a result, a width of the wiring 9 is the same as that of the resist product portion 18. That is, the patterning accuracy of the wiring 9 is high.

Thereafter, in the resist removing step, the first etching resist 17 is removed by, for example, peeling or the like.

Thereafter, as shown by a phantom line of FIG. 2D, in the cover step, the cover layer 10 is disposed at one side in the thickness direction of the support sheet 2 so as to cover one surface in the thickness direction and the side surfaces of the wiring 9.

Thereafter, the support sheet 2 is trimmed to form the opening portion 14. At the same time, the joint 24 (ref: FIG. 1) is formed.

Thus, the wiring circuit board assembly sheet 1 is produced.

Thereafter, the wiring circuit board 3 is disconnected from the support sheet 2 to be collected (sampled) from the wiring circuit board assembly sheet 1. On the other hand, the dummy wiring circuit board 11 remains supported by the support sheet 2, and is then discarded together with the support sheet 2.

Then, in the method for producing the wiring circuit board assembly sheet 1, in the etching step, when the etching solution reaches the second area 7 from the product region 4, even in a case where the etching solution falls down to cause the turbulence, the accuracy of the dummy wiring circuit board 11 disposed in the first area 6 decreases, and the influence of the turbulence of the etching solution with respect to the wiring circuit board 3 decreases, so that a decrease in the accuracy of the wiring circuit board 3 disposed in the product region 4 is suppressed. Therefore, in the wiring circuit board assembly sheet 1, it is excellent in reliability of the wiring circuit board 3.

Further, even when the turbulence of the etching solution occurs in the entire second area 7, since the dummy wiring circuit board 11 is disposed in the entire first area 6, it is possible to decrease the influence of the turbulence of the etching solution with respect to the entire product region 4.

Furthermore, the wiring circuit board 3 includes the wiring 9 made of the conductive layer 15, and the dummy wiring circuit board 11 includes the dummy wiring 13 made of the conductive layer 15. Therefore, in the production of the wiring circuit board assembly sheet 1, the first etching resist 17 is disposed in the conductive layer 15 corresponding to the wiring 9 and the dummy wiring 13. Then, when the etching solution reaches the second area 7 from the first area 6, even in a case where the etching solution falls down to cause the turbulence, the accuracy of the dummy wiring 13 decreases, and a decrease in the accuracy of the wiring 9 is suppressed. Therefore, in the wiring circuit board assembly sheet 1, it is excellent in reliability of the wiring 9.

Modified Examples

Next, modified examples of the first embodiment are described. In the following modified examples, the same reference numerals are provided for members and steps corresponding to each of those in the above-described first embodiment, and their detailed description is omitted. Further, the first embodiment and the modified examples can be appropriately used in combination. Furthermore, each of the modified examples can achieve the same function and effect as that of the first embodiment unless otherwise specified.

In the first embodiment, as shown in FIG. 1, the dummy wiring circuit board 11 is disposed in the entire first area 6. Alternatively, the dummy wiring circuit board 11 may be also disposed in a portion of the first area 6.

Specifically, a first embodiment in which the dummy wiring circuit board 11 has the first dummy wiring circuit board 26 and does not have the second dummy wiring circuit board 27, and a second embodiment in which the dummy wiring circuit board 11 has the second dummy wiring circuit board 27 and does not have the first dummy wiring circuit board 26 are used.

Figure 3:
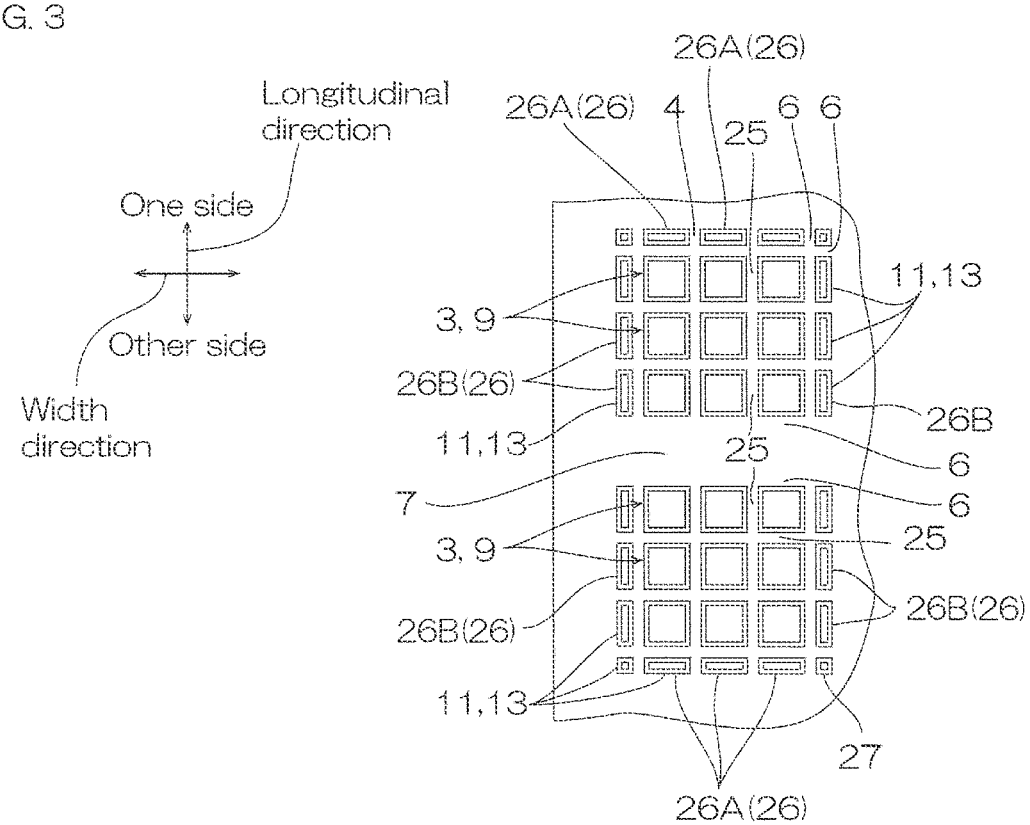
FIG. 3 shows a plan view of a modified example of the first embodiment.

Further, as shown in FIG. 3, the dummy wiring circuit board 11 may not be disposed in the first area 6 disposed between the product regions 4 adjacent (close) to each other in the longitudinal direction, and on the other hand, the dummy wiring circuit board 11 may be also disposed in the first area 6 other than that.

In the modified example, in each first area 6, the dummy wiring circuit board 11 is disposed along a line having a generally square U-shape (U-shape) when viewed from the top.

Second Embodiment

In the following second embodiment, the same reference numerals are provided for members and steps corresponding to each of those in the above-described first embodiment, and their detailed description is omitted. Further, the first embodiment and the second embodiment can be appropriately used in combination. Furthermore, the second embodiment can achieve the same function and effect as that of the first embodiment unless otherwise specified.

Figure 4:
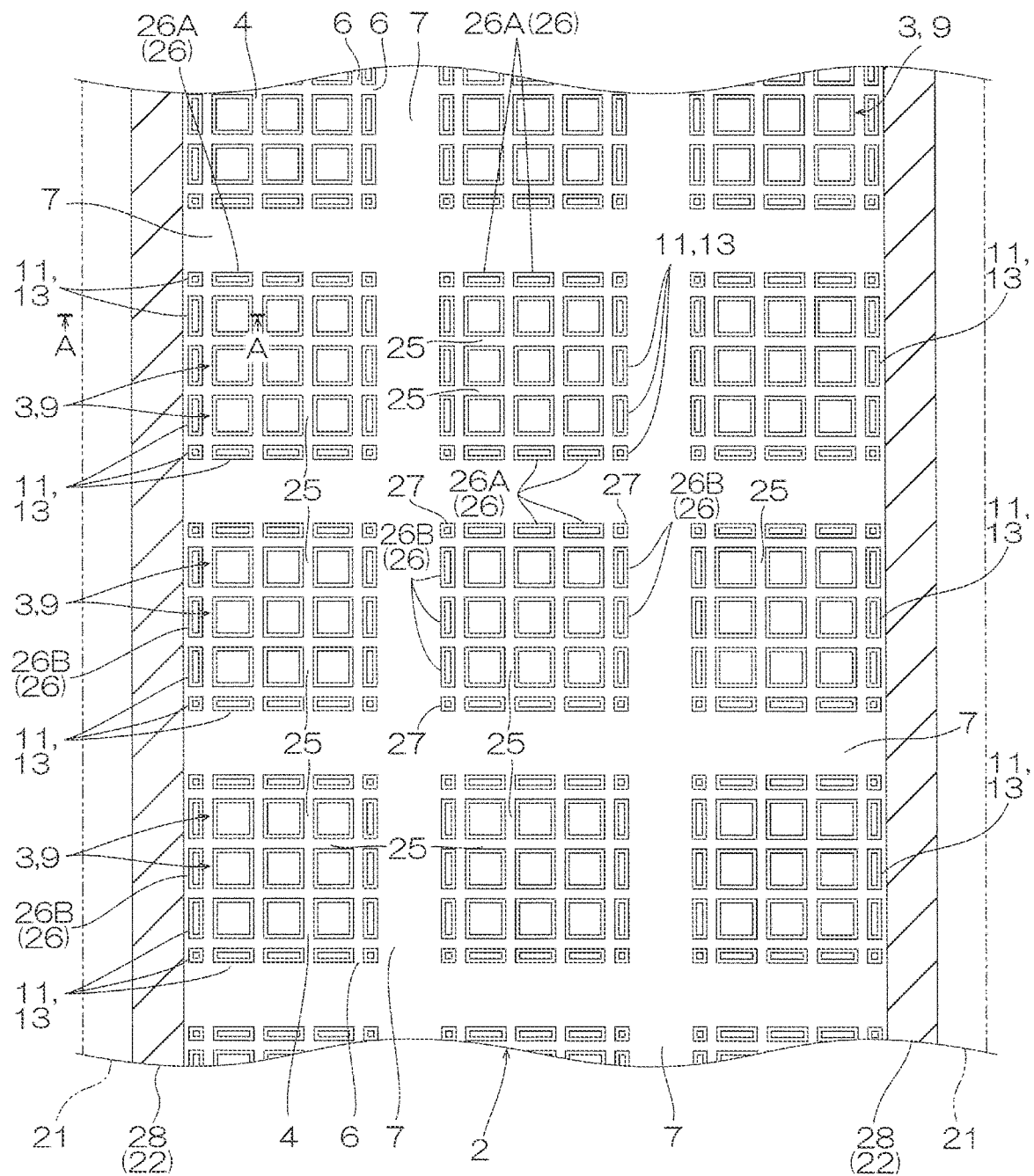
FIG. 4 shows a plan view of a second embodiment of a wiring circuit board assembly sheet.

The second embodiment is described with reference to FIGS. 4 to 5C. In FIG. 4, a conductive end portion 28 (described later) is shown by hatching in order to clearly show its arrangement and shape. Further, since a resist end portion 21 (described later) is not included in the wiring circuit board assembly sheet 1, and is used in the middle of the production, it is shown by a phantom line.

In the first embodiment, as shown in FIG. 1, the entire second area 7 is partitioned as the blank area. Alternatively, as shown in FIGS. 4 and 5C, the conductive end portion 28 may be also included in the wiring circuit board assembly sheet 1 so as to be included in a portion of the second area 7.

In the second embodiment, the wiring circuit board assembly sheet 1 includes the conductive end portion 28 which is independent of the wiring 9 and the dummy wiring 13.

The conductive end portion 28 is disposed at both end portions in the width direction of the support sheet 2. Each of the two conductive end portions 28 has a generally belt shape extending in the longitudinal direction. The conductive end portion 28 is partially included in the second area 7, and is not included in the first area 6.

The outer end edge in the width direction of the conductive end portion 28 coincides with the outer end edge in the width direction of the support sheet 2 when viewed from the top. On the other hand, the inner end edge in the width direction of the conductive end portion 28 coincides with the boundary between the second area 7 and the first area 6 when viewed from the top, and specifically, is disposed at slight intervals to the outer dummy wiring 13.

Figure 5A:
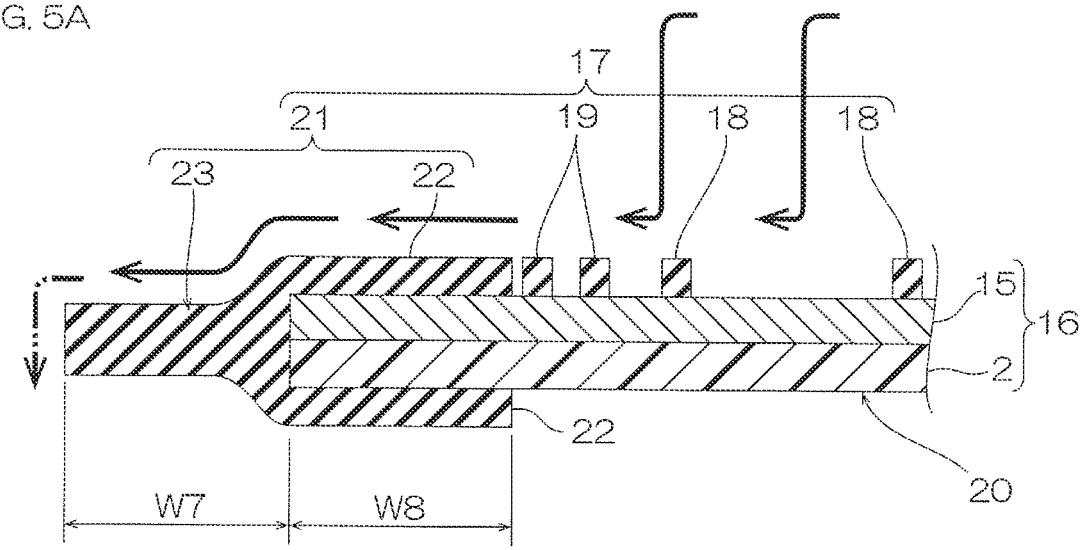
FIGS. 5A to 5C show production steps of the wiring circuit board assembly sheet shown in FIG. 4, and cross-sectional views along an A-A line of FIG. 4.

To produce the wiring circuit board assembly sheet 1, as shown in FIG. 5A, in the resist disposing step, the first etching resist 17 including the resist end portion 21 is disposed on the two-layer substrate 16. Specifically, the first etching resist 17 includes the resist product portion 18 and the resist dummy portion 19, and furthermore, includes the resist end portion 21. The resist end portion 21 integrally includes a resist base end portion 22 and a resist protrusion portion 23.

The resist base end portion 22 is disposed corresponding to the conductive end portion 28, and specifically, disposed on one surface and the other surface in the thickness direction of the two-layer substrate 16 in the same pattern as the conducive end portion 28.

The resist protrusion portion 23 is a free end portion which protrudes from each of the outer end surfaces in the width direction of the resist base end portion 22 toward each of both outer sides in the width direction. Further, the resist protrusion portion 23 has a generally blade shape extending from each of the outer end surfaces in the width direction of the two-layer substrate 16 toward each of both outer sides in the width direction. Further, as shown by the phantom line of FIG. 4, the resist protrusion portion 23 is in parallel with the resist base end portion 22, and has a generally belt shape when viewed from the top extending in the longitudinal direction.

A width (protrusion length) W7 of the resist protrusion portion 23 and a width (length in the width direction) W8 of the resist base end portion 22 are set so that the resist end portion 21 becomes the place (area) where the etching solution just before falling from the front end (outer end edge in the width direction) of the resist protrusion portion 23 sufficiently stays (described later).

In the etching step, as shown by the thick line arrow, the etching solution discharged from the discharge port to the resist product portion 18 and the resist dummy portion 19 gently flows (or stays) in the resist base end portion 22 to then fall from the front end edge of the resist protrusion portion 23 toward the other side in the thickness direction.

Figure 5B:
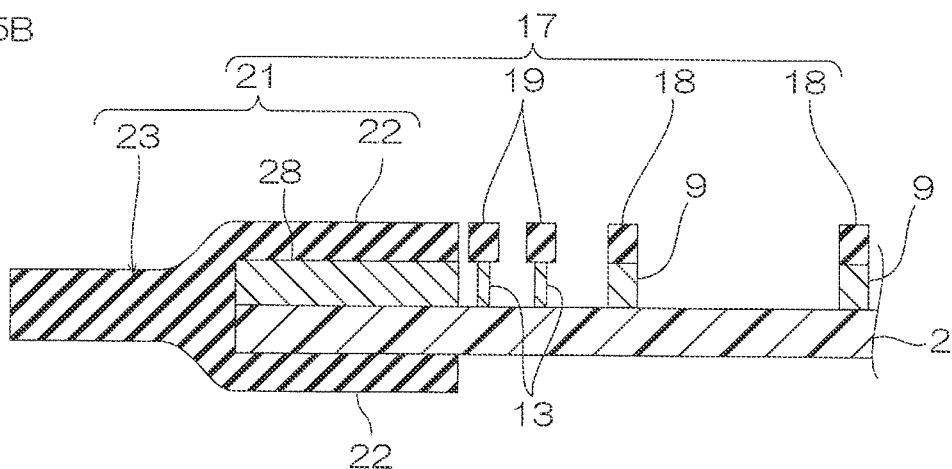

As shown in FIG. 5B, in the etching step, the conductive end portion 28 is formed from the conductive layer 15 covered with the resist base end portion 22.

Figure 5C:
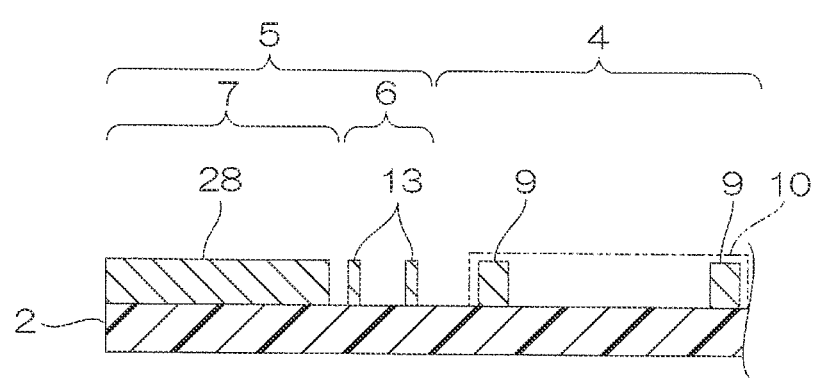

As shown in FIG. 5C, in the resist removing step, the first etching resist 17 is removed.

Thus, the wiring circuit board assembly sheet 1 including the conductive end portion 28 is produced.

Then, the wiring circuit board assembly sheet 1 has a long shape, and the wiring circuit board assembly sheet 1 is produced, while the resist laminate 20 is conveyed in the longitudinal direction.

However, as shown by a phantom line arrow of FIG. 2B, since the etching solution falls from both end edges in the width direction of the resist laminate 20, the turbulence occurs in the etching solution just before falling at both end portions in the width direction.

However, in the second embodiment, as shown in FIG. 5A, since the conductive end portion 28 is formed, and both end portions in the width direction included in the second area 7 and the resist protrusion portion 23 protruding therefrom toward both outer sides in the width direction are provided, even when the turbulence occurs in the etching described above, the product region 4 is less susceptible to the influence. Therefore, it is possible to obtain the wiring circuit board 3 having excellent reliability. That is, the dimensional accuracy of the wiring 9 corresponding to the resist product portion 18 is excellent.

Further in the etching step, as shown in FIG. 5A, it is possible to move away the place where the turbulence of the etching solution is likely to occur from the resist product portion 18 by the resist protrusion portion 23. Thus, it is possible to decrease the influence of the turbulence of the etching solution in the resist product portion 18.

Further, the resist base end portion 22 supports the resist protrusion portion 23. Since the resist base end portion 22 is disposed at both sides in the thickness direction of the two-layer substrate 16, it further more firmly supports the resist protrusion portion 23.

Modified Examples

Next, modified examples of the second embodiment are described. In the following modified examples, the same reference numerals are provided for members and steps corresponding to each of those in the above-described second embodiment, and their detailed description is omitted. Further, the second embodiment and the modified examples can be appropriately used in combination. Furthermore, each of the modified examples can achieve the same function and effect as that of the second embodiment unless otherwise specified.

In the second embodiment, in the resist disposing step, the resist end portion 21 has the resist base end portion 22 and the resist protrusion portion 23. Alternatively, for example, though not shown, it is also possible for the resist end portion 21 to have the resist base end portion 22 without having the resist protrusion portion 23. In the modified example, the wiring circuit board assembly sheet 1 to be produced includes the conductive end portion 28.

In the second embodiment, the wiring circuit board assembly sheet 1 includes the dummy wiring circuit board 11 and the conductive end portion 28. Alternatively, for example, though not shown, it is also possible for the wiring circuit board assembly sheet 1 to include the conductive end portion 28 without including the dummy wiring circuit board 11.

When the wiring circuit board assembly sheet 1 includes the conductive end portion 28, in the etching step, the etching solution can sufficiently stay in the resist end portion 21, and it is possible to suppress the turbulence of the etching solution in the product region 4.

Third Embodiment

Next, a third embodiment is described with reference to FIGS. 6A to 8I.

In the following third embodiment, the same reference numerals are provided for members and steps corresponding to each of those in the above-described first to second embodiments, and their detailed description is omitted. Further, the first to third embodiments can be appropriately used in combination. Furthermore, the third embodiment can achieve the same function and effect as that of the first to second embodiments unless otherwise specified.

As shown in FIG. 2D, in the first embodiment, the dummy wiring circuit board 11 includes the dummy wiring 13. Alternatively, in the third embodiment, as shown in FIG. 8I, the dummy wiring circuit board 11 further includes a dummy support substrate 32.

Figure 6A:
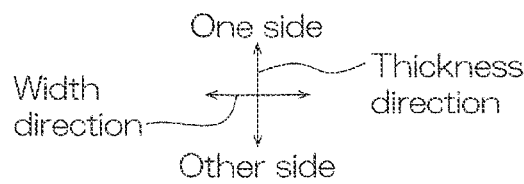
FIGS. 6A to 6C show production steps (cross-sectional view) of a third embodiment of a wiring circuit board assembly sheet.
Figure 6A:
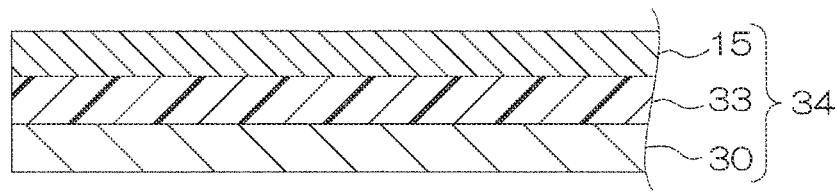
Figure 6B:
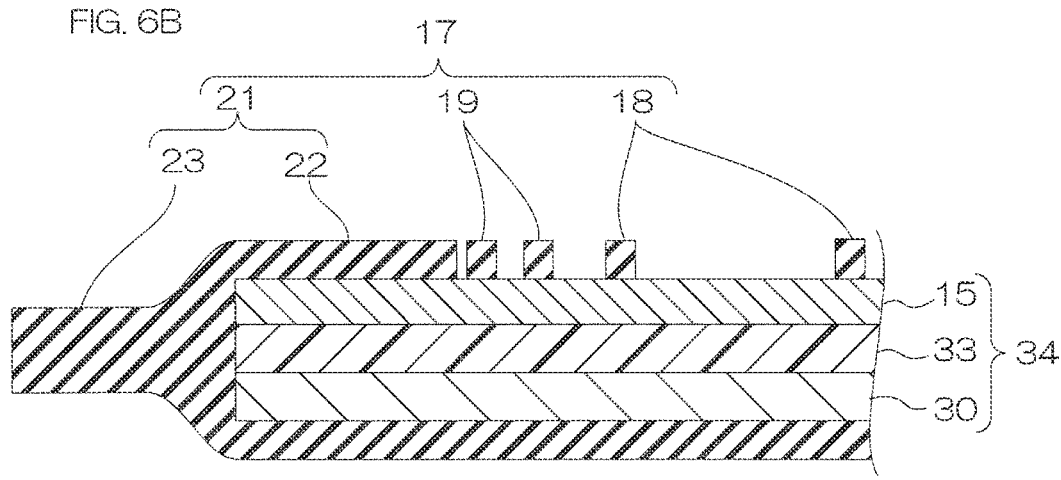
Figure 6C:
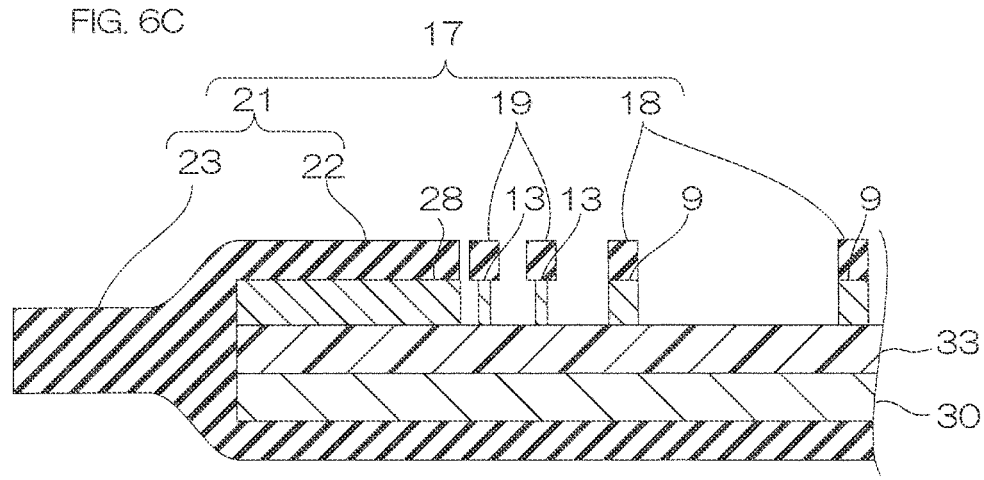
Figure 8G:
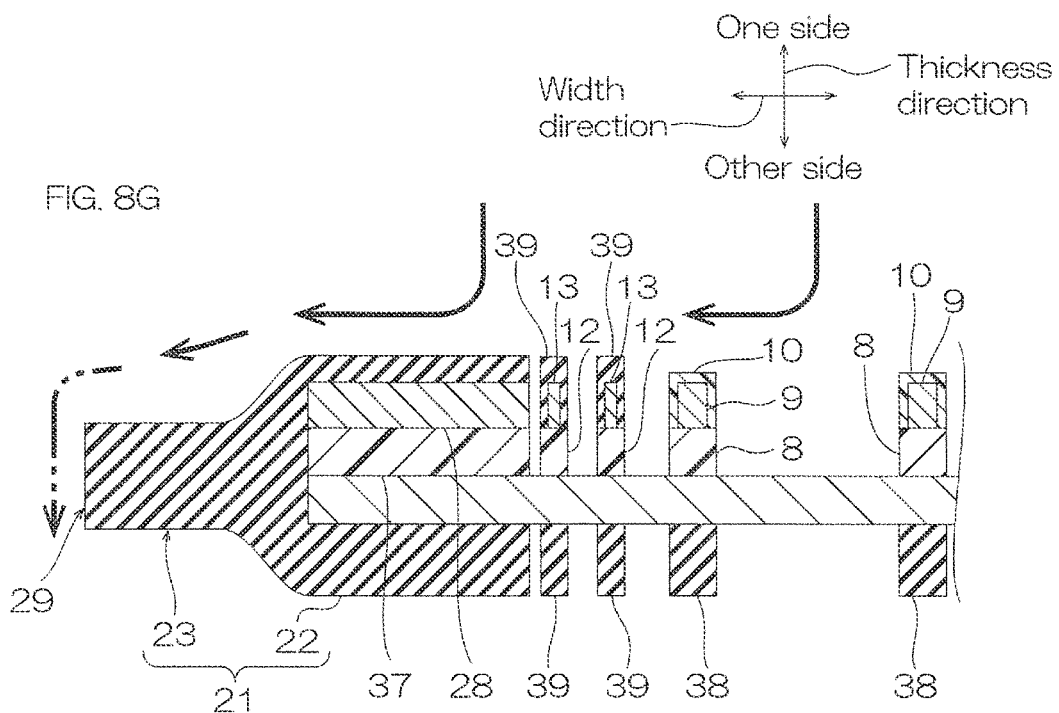
FIGS. 8G to 8I, subsequent to FIG. 7F, show production steps (cross-sectional view) of the third embodiment of the wiring circuit board assembly sheet.
Figure 8H:
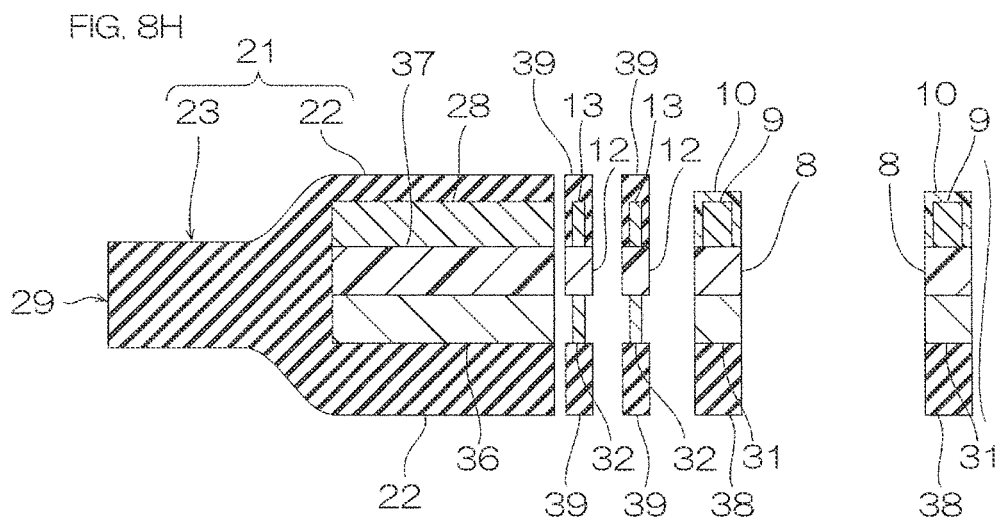
Figure 8I:
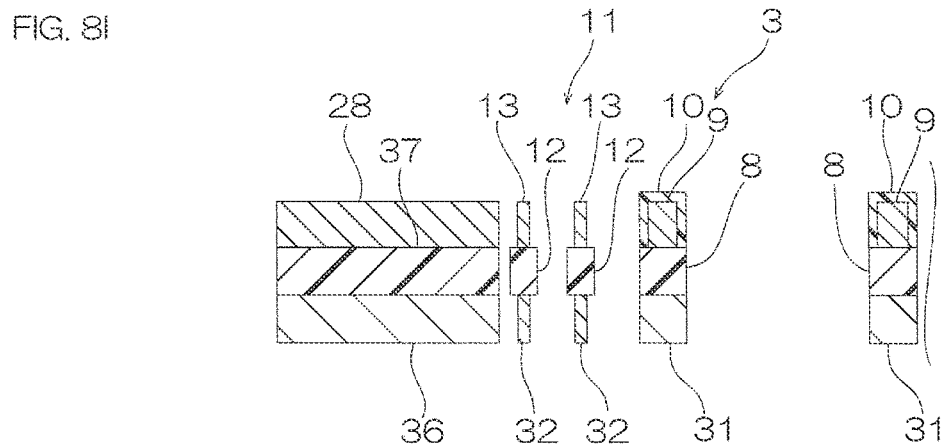

In the third embodiment, for example, in the method for producing the wiring circuit board assembly sheet 1, as shown in FIGS. 6B to 6C, the dummy wiring 13 is formed, and thereafter, as shown in FIGS. 8G to 8H, the dummy support substrate 32 is formed.

Specifically, in the third embodiment, the method for producing the wiring circuit board assembly sheet 1 includes two resist disposing steps, two etching steps, and two resist removing steps. Specifically, the method for producing the wiring circuit board assembly sheet 1 includes a substrate preparation step, a first resist disposing step as one example of a first step, a first etching step as one example of a second step, a first resist removing step, a base layer forming step, a cover step, a second resist disposing step as one example of a third step, a second etching step as one example of a fourth step, and a second resist removing step.

In the substrate preparation step, for example, as shown in FIG. 6A, first, a three-layer substrate 34 including a metal-based layer 30, a resin layer 33, and the conductive layer 15 is prepared.

The metal-based layer 30 is a sheet for forming the other surface in the thickness direction of the three-layer substrate 34. Examples of a material for the metal-based layer 30 include the metal-based materials illustrated as a material for the metal-based layer 30.

The resin layer 33 is disposed on one surface in the thickness direction of the metal-based layer 30. Examples of a material for the resin layer 33 include the resins illustrated in the support sheet 2 of the first embodiment.

The conductive layer 15 is disposed on one surface in the thickness direction of the resin layer 33 and forms one surface in the thickness direction of the three-layer substrate 34.

As shown in FIG. 6B, in the first resist disposing step, the first etching resist 17 including the resist end portion 21 is disposed on one surface and the other surface in the thickness direction of the three-layer substrate 34.

As shown in FIG. 6C, in the first etching step, by etching the conductive layer 15 exposed from the resist product portion 18, the resist dummy portion 19, and the resist end portion 21, the wiring 9, the dummy wiring 13, and the conductive end portion 28 are formed.

As shown in FIG. 7D, in the first resist removing step, the first etching resist 17 is removed.

As shown in FIG. 7E, by patterning the resin layer 33, the base layer 8, the dummy base layer 12, and a base end portion 37 are formed. The base end portion 37 has a pattern corresponding to the conductive end portion 28.

As shown in FIG. 7F, in the cover step, the cover layer 10 is disposed.

As shown in FIG. 8G, in the second resist disposing step, a second etching resist 29 is disposed in the metal-based layer 30. The second etching resist 29 includes a second resist product portion 38 corresponding to a support substrate 31, a second resist dummy portion 39 corresponding to the dummy support substrate 32, and the resist end portion 21.

The second resist product portion 38 is disposed on the other surface in the thickness direction of the metal-based layer 30, and has the same pattern as the support substrate 31 (ref: FIG. 8H) when viewed from the top.

The second resist dummy portion 39 is disposed on the other surface in the thickness direction of the metal-based layer 30 and one surface in the thickness direction of the dummy base layer 12, and has the same pattern as the dummy support substrate 32 when viewed from the top (ref: FIG. 8H).

The resist end portion 21 integrally has the resist base end portion 22 and the resist protrusion portion 23.

As shown in FIG. 8H, in the second etching step, by etching the metal-based layer 30 exposed from the second etching resist 29 (the base layer 8 and the cover layer 10), the support substrate 31, the dummy support substrate 32, and a support substrate end portion 36 are formed. The support substrate end portion 36 has the same shape as the conductive end portion 28 when viewed from the top.

As shown in FIG. 8I, in the second resist removing step, the second etching resist 29 is removed.

Thus, the wiring circuit board assembly sheet 1 including the wiring circuit board 3, the dummy wiring circuit board 11, the conductive end portion 28, and the support substrate end portion 36 is obtained.

In the production of the third embodiment of the wiring circuit board assembly sheet 1, the second etching resist 29 corresponding to the support substrate 31 and the dummy support substrate 32 is disposed in the metal-based layer 30. Then, when the etching solution reaches the second area 7 from the first area 6, even in a case where the etching solution falls down to cause the turbulence, the accuracy of the dummy support substrate 32 decreases, and the influence of the turbulence of the etching solution with respect to the wiring circuit board 3 decreases, so that a decrease in the accuracy of the support substrate 31 is suppressed. Therefore, in the wiring circuit board assembly sheet 1, it is excellent in reliability of the support substrate 31.

Further, the wiring circuit board assembly sheet 1 has a long shape, and the wiring circuit board assembly sheet 1 is produced by etching, while the metal-based layer 30 in which the second etching resist 29 is provided is conveyed in the longitudinal direction.

In the second etching step, since the etching solution falls from both end edges in the width direction of the wiring circuit board assembly sheet 1, the turbulence of the etching solution occurs at both end portions in the width direction.

However, since the support substrate end portion 36 is formed, and both end portions in the width direction included in the second area 7 and the resist protrusion portion 23 protruding therefrom toward both outer sides in the width direction are provided, even when the turbulence occurs in the etching described above, the product region 4 is less susceptible to the influence. Therefore, it is possible to obtain the wiring circuit board 3 having excellent reliability. That is, the dimensional accuracy of the support substrate 31 corresponding to the resist product portion 18 is excellent.

Further, in the second etching step, as shown in FIG. 8G, it is possible to move away the place where the turbulence of the etching solution is likely to occur from the resist product portion 18 by the resist protrusion portion 23. Thus, it is possible to decrease the influence of the turbulence of the etching solution in the resist product portion 18.

Further, the resist base end portion 22 supports the resist protrusion portion 23. Since the resist base end portion 22 is disposed at both sides in the thickness direction of the three-layer substrate 34, it further more firmly supports the resist protrusion portion 23.

Modified Examples

Next, modified examples of the third embodiment are described. In the following modified examples, the same reference numerals are provided for members and steps corresponding to each of those in the above-described third embodiment, and their detailed description is omitted. Further, the first to third embodiments and the modified examples can be appropriately used in combination. Furthermore, each of the modified examples can achieve the same function and effect as that of the third embodiment unless otherwise specified.

In the third embodiment, the dummy support substrate 32 and the dummy wiring 13 are formed. Further, in the first embodiment, the dummy wiring 13 is formed.

In the modified example, though not shown, it is also possible to form the dummy support substrate 32 without forming the dummy wiring 13.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board assembly sheet of the present invention is used for various applications.

DESCRIPTION OF REFERENCE NUMBER

1 Wiring circuit board assembly sheet 1
2 Support sheet 2
3 Wiring circuit board 3
4 Product region 4
5 Margin region 5
6 First area 6
7 Second area 7
9 Wiring 9
11 Dummy wiring circuit board 11
13 Dummy wiring 13
15 Conductive layer 15
17 First etching resist 17
28 Conductive end portion 28
29 Second etching resist 29
30 Metal-based layer 30
31 Support substrate 31
32 Dummy support substrate 32

The invention claimed is:

1. A wiring circuit board assembly sheet, comprising:
a product region and a margin region which partition the wiring circuit board assembly sheet;
wherein in the product region, a plurality of wiring circuit boards serve as products and are disposed in alignment, and the margin region surrounds the product region, with the margin region having a first area adjacent to the product region and a second area located at the opposite side of the product region with respect to the first area,
wherein the wiring circuit board assembly sheet includes a first dummy wiring circuit board and a second dummy wiring circuit board disposed in at least a portion of the first area and smaller than a wiring circuit board of the plurality of wiring circuit boards; and
wherein the second dummy wiring circuit board is smaller than the first dummy wiring circuit board.

2. The wiring circuit board assembly sheet according to claim 1, wherein
the first dummy wiring circuit board and the second dummy wiring circuit board are disposed in the entire first area.

3. The wiring circuit board assembly sheet according to claim 1, wherein
the wiring circuit board includes a wiring made of a conductive layer; and
the first dummy wiring circuit board and the second dummy wiring circuit board each include a dummy wiring made of the conductive layer.

4. The wiring circuit board assembly sheet according to claim 3, wherein
the wiring circuit board assembly sheet has a long shape, has both end portions in a width direction perpendicular to a longitudinal direction and included in the second area, and
includes a conductive end portion disposed at both end portions in the width direction and made of the conductive layer.

5. The wiring circuit board assembly sheet according to claim 1, wherein
the wiring circuit board includes a support substrate made of a metal-based layer, and
the first dummy wiring circuit board and the second dummy wiring circuit board each include a dummy support substrate made of the metal-based layer.

6. The wiring circuit board assembly sheet according to claim 5, wherein
the wiring circuit board assembly sheet has a long shape, has both end portions in a width direction perpendicular to a longitudinal direction and included in the second area, and
includes a metal-based end portion disposed at both end portions in the width direction and made of the metal-based layer.

7. A wiring circuit board assembly sheet, comprising:
a product region and a margin region which partition the wiring circuit board assembly sheet;
wherein in the product region, a plurality of wiring circuit boards serve as products and are disposed in alignment, and the margin region surrounds the product region, with the margin region having a first area adjacent to the product region and a second area located at the opposite side of the product region with respect to the first area, wherein
a wiring circuit board of the plurality of wiring circuit boards includes a wiring made of a conductive layer; and
the wiring circuit board assembly sheet has a long shape, has both end portions in a width direction perpendicular to a longitudinal direction and included in the margin region, and
includes a conductive end portion disposed at both end portions in the width direction and made of the conductive layer;
wherein the wiring circuit board assembly sheet includes a first dummy wiring circuit board and a second dummy wiring circuit board disposed in at least a portion of the first area and smaller than the wiring circuit board; and wherein the second dummy wiring circuit board is smaller than the first dummy wiring circuit board.

8. A wiring circuit board assembly sheet, comprising:
a product region and a margin region which partition the wiring circuit board assembly sheet;
wherein in the product region, a plurality of wiring circuit boards serve as products and are disposed in alignment, and the margin region surrounds the product region, with the margin region having a first area adjacent to the product region and a second area located at the opposite side of the product region with respect to the first area, wherein
a wiring circuit board of the plurality of wiring circuit boards includes a support substrate made of a metal-based layer; and
the wiring circuit board assembly sheet has a long shape, has both end portions in a width direction perpendicular to a longitudinal direction and included in the margin region, and
includes a metal-based end portion disposed at both end portions in the width direction and made of the metal-based layer;
wherein the wiring circuit board assembly sheet includes a first dummy wiring circuit board and a second dummy wiring circuit board disposed in at least a portion of the first area and smaller than the wiring circuit board; and
wherein the second dummy wiring circuit board is smaller than the first dummy wiring circuit board.

9. A method for producing a wiring circuit board assembly sheet, the wiring circuit board assembly sheet according to claim 3 comprising:
a first step of disposing a first etching resist on a conductive layer so as to correspond to a wiring and a dummy wiring, and
a second step of etching the conductive layer exposed from the first etching resist to form the wiring and the dummy wiring.

10. The method for producing a wiring circuit board assembly sheet according to claim 9, wherein
the conductive layer is conveyed along a conveyance direction in the second step and has
both end portions in a width direction perpendicular to the conveyance direction and included in the second area, and
in the first step, the first etching resist is formed so as to cover one surface in a thickness direction of both end portions in the width direction of the conductive layer and protrude from both end portions in the width direction of the conductive layer toward both outer sides in the width direction.

11. A method for producing a wiring circuit board assembly sheet, the wiring circuit board assembly sheet according to claim 5 comprising:
a third step of disposing a second etching resist on a metal-based layer so as to correspond to a support substrate and a dummy support substrate, and
a fourth step of etching the metal-based layer exposed from the second etching resist to form the support substrate and the dummy support substrate.

12. The method for producing a wiring circuit board assembly sheet according to claim 11, wherein
the metal-based layer is conveyed along a conveyance direction in the fourth step and has both end portions in a width direction perpendicular to the conveyance direction and included in the second area, and
in the third step, the second etching resist is formed so as to cover one surface in a thickness direction of both end portions in the width direction of the metal-based layer and protrude from both end portions in the width direction of the metal-based layer toward both outer sides in the width direction.

13. A wiring circuit board assembly sheet comprising:
a product region and a margin region which partition the wiring circuit board assembly sheet;
wherein in the product region, a plurality of wiring circuit boards serve as products and are disposed in alignment, and the margin region surrounds the product region, with the margin region having a first area adjacent to the product region and a second area located at the opposite side of the product region with respect to the first area,
the wiring circuit board assembly sheet includes a first dummy wiring circuit board disposed at both sides in a longitudinal direction and both sides in a width direction of the product region, and a second dummy wiring circuit board disposed at an obliquely outer side of the product region.

14. A wiring circuit board assembly sheet, comprising:
a product region and a margin region which partition the wiring circuit board assembly sheet;
wherein in the product region, a plurality of wiring circuit boards serve as products and are disposed in alignment, and the margin region surrounds the product region, with the margin region having a first area adjacent to the product region and a second area located at the opposite side of the produce region with respect to the first area, wherein
a wiring circuit board of the plurality of wiring circuit boards includes a wiring made of a conductive layer; and
the wiring circuit board assembly sheet has a long shape, has both end portions in a width direction perpendicular to a longitudinal direction and included in the margin region, and includes a conductive end portion disposed at both end portions in the width direction and made of the conductive layer;
wherein the wiring circuit board assembly sheet includes a first dummy wiring circuit board disposed at both sides in a longitudinal direction and both sides in a width direction of the product region, and a second dummy wiring circuit board disposed at an obliquely outer side of the product region.

15. A wiring circuit board assembly sheet, comprising:
a product region and a margin region which partition the wiring circuit board assembly sheet;
wherein in the product region, a plurality of wiring circuit boards serve as products and are disposed in alignment, and the margin region surrounds the product region, with the margin region having a first area adjacent to the product region and a second area located at the opposite side of the produce region with respect to the first area, wherein
a wiring circuit board of the plurality of wiring circuit boards includes a support substrate made of a metal-based layer; and
the wiring circuit board assembly sheet has a long shape, has both end portions in a width direction perpendicular to a longitudinal direction and included in the margin region, and includes a metal-based end portion disposed at both end portions in the width direction and made of the metal-based layer;

wherein the wiring circuit board assembly sheet includes a first dummy wiring circuit board disposed at both sides in a longitudinal direction and both sides in a width direction of the product region, and a second dummy wiring circuit board disposed at an obliquely outer side of the product region.

* * * * *